(12) United States Patent
Kim et al.

(10) Patent No.: US 6,649,327 B2
(45) Date of Patent: Nov. 18, 2003

(54) METHOD OF PATTERNING ELECTRICALLY CONDUCTIVE POLYMERS

(75) Inventors: Woohong Kim, Fairfax, VA (US); Zakya Kafafi, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 22 days.

(21) Appl. No.: 09/983,692

(22) Filed: Oct. 25, 2001

(65) Prior Publication Data

US 2003/0087195 A1 May 8, 2003

(51) Int. Cl.[7] .................................................. G03F 7/00
(52) U.S. Cl. ........................................ 430/313; 430/311
(58) Field of Search ................................ 430/311, 313; 252/500, 501.1

(56) References Cited

U.S. PATENT DOCUMENTS 5,976,284 A    11/1999   Calvert et al. ................. 156/51
6,045,977 A  * 4/2000   Chandross ................... 430/311
6,331,356 B1 * 12/2001  Angelopoulos ........... 428/411.1

OTHER PUBLICATIONS

"Patterning Orgacon Film by Means of UV Lithography" ORGACON, Orgacon Conductive Transparent Films pp. 1–3 (2001) Agfa–Gevaert N.V.

* cited by examiner

Primary Examiner—Kathleen Duda
(74) Attorney, Agent, or Firm—Stephen T Hunnius; John J Karasek

(57) ABSTRACT

A method of patterning electrically conductive polymers is: forming a surface of a conducting polymer on a substrate, applying a mask to this surface, applying irradiation to form regions of exposed conducting polymer and regions of unexposed conducting polymer, removing the mask, and gently removing by non-chemically reactive means the regions of exposed conducting polymer.

16 Claims, 4 Drawing Sheets

METHOD OF PATTERNING ELECTRICALLY CONDUCTIVE POLYMERS

BACKGROUND OF THE INVENTION

1. Field of the Invention

The present invention relates to an inexpensive and simple method to selectively pattern conducting polymer film on a substrate.

2. Discussion of the Background

Most electronics devices such as liquid crystal displays (LCDs) and organic light emitting devices (OLEDs) require electrically conductive and transparent electrodes. Typically, $In_2O_3$:Sn (ITO) is used as electrode since it is highly conductive and transparent in the visible region (400~800 nm). ITO can be vapor-deposited, sputtered or chemically or pulsed laser vapor deposited (CVD) onto glass or plastic substrates. ITO films with a surface resistance of less than 500 Ω/square and a high transparency of >80% can be easily obtained using these deposition methods. However, the production of ITO must be carried out under vacuum and is very costly. Also, an additional multi-step photolithographic process is necessary to provide the substrate with the desired pattern geometry for the specific application. The photolithographic patterning method employs various chemicals including cleaning solutions, photoresist/solvent, acidic etchant, developer and stripper, most of which are environmentally toxic and hazardous.

It is known that polymers can be electrically conductive when they are in a polyconjugated form. However, due to a relatively large band gap of 1.5~4 eV, they are intrinsically insulating or have very low conductivity. The conductivity of these semiconductor polymers can be dramatically increased, by doping them with the proper oxidizing agent such as $I_2$, $FeCl_3$, sulphonates, perchlorates, $AsF_5$ and $SO_3$. The positive charges generated on the polymer are compensated by the negatively charged counter ions. The doped conducting polymers are generally soluble in organic solvents and some are even soluble in water depending on the substituents and polymerization methods. The surface resistance of the conducting polymeric films is found to be in the range of ~100–200 Ω/square which is very comparable to values reported for metal oxides such as ITO. They can be processed by various methods such as spin or spray coating and inkjet printing onto various rigid and flexible substrates. Due to their high conductivity and ease of processability, these conducting polymers have attracted much attention as potential electrodes for display devices such as LCDs and OLEDs, interconnection in integrated chips and printed circuit boards. Other electronic applications include anti-static and electromagnetic shielding. It has been shown that the light emitting devices made with a transparent conducting polymer anode yield improved performance over a conventional ITO anode. The improvement is due to the ability of the polymer anode to make a reproducibly clean interface that substantially slows the device degradation.

However, as with conventional anode materials, the conducting polymer needs to be patterned with a suitable geometry design for a specific device. For example, a 80 mm×20 mm size passive matrix OLED with 256×64 pixels, the conducting layer is typically patterned in a series of stripes with a ~100 μm width and ~100 μm gap between the stripes. Therefore, it is extremely important to explore new cost effective methods for patterning materials used for devices. In addition, conducting polymers that maintain their intrinsic properties such as conductivity, optical transparency and physical characteristics are highly desirable.

Conventional photolithographic-techniques may be employed to pattern the conductive polymers. However, these processes were originally developed for metal oxide patterning in which the intrinsic electrical and physical properties of the conductive layer are not affected by the relatively harsh treatment and complicated wet process. This patterning approach is not suitable for conducting polymers, since it dramatically increases their surface resistance. The geometry of the conductive layer can also be detrimentally modified or etched from the substrates. A mild, simple and economical technique to pattern conducting polymers is necessary for their realization in electronic, electro-optic and opto-electronic devices.

A method of patterning an electrically conductive polymer, using a thiophene monomer, 3,4-ethylenedioxythiophene (EDOT), has been patented. See U.S. Pat. Nos. 5,976,284 and 5,447,824. EDOT is mixed with a solution of an oxidizing agent, tris (toluenesulphonate)Fe(III), and the base, imidazole, in 1-butanol. After spin coating the solution, the layer is exposed to deep UV light (λ<300 mm) in accordance with the desired pattern. Subsequently, the layer is heated to initiate a polymerization reaction. In the unexposed area, the conductive polymer retains its electrical properties such as a low square resistance while an insulating polymer is formed in the areas exposed to deep UV light. The polymer layer may then be extracted with methanol, water or 1-butanol to reduce the oxidizing agent. However, this technique requires precise control of the amount of base to lower the polymerization reaction rate on the substrate. In addition, the reaction mixture is unstable and spontaneously reacts to polymerize even at room temperature or higher. Further, it is impossible to completely remove the unreacted oxidizing agent and requires a large quantity of solvent. This method suffers from a major drawback in which the conductivity difference in the conducting area and the non-conducting area is not large enough such that electric current continues to flow through the non-conducting part. It is claimed that the conductivities of the conducting and non-conducting parts are ~300 S/cm and $10^{-2}$ S/cm, respectively. The conductivity of the non-conducting part is still quite high, making this method unsuitable for most applications including those for electronic and semiconductor devices. Additionally, cross talk may occur between adjacent electrodes when used, for instance, in a passive matrix device.

A similar method of patterning a conductive polymer uses a mixture of a conjugated polymer, polyaniline, a photo-acid generator (generates free acid upon UV irradiation) and a solvent that are spin coated onto a substrate. See patent EP-A-399299. After heating, UV irradiation through a photo-mask and further heating, the exposed areas of the polymer layer become electrically conductive, whereas the non-exposed areas remain non-conductive. Unfortunately, this method provides a specific conductivity on the order of 0.01~0.1 S/cm, which is too low for practical use in electronic and semiconductor devices.

An example of the multi-step prior art procedure follows. The prior art involves the use of a photo-resist and chemicals to strip the resist. The resist is spincoated onto a substrate containing a conductive polymer, followed by pre-exposure baking of the substrate, polymer, and resist at 100 degrees Celsius for three minutes. The substrate is then exposed to light with a wavelength of 380 nm, followed by post-exposure baking. The substrate is then developed or 40 seconds in a 20% solution of AZ303 developer. Immediately after development, the substrate must be rinsed with DI water for 40 seconds. The substrate is then dried at 90 degrees Celsius for 1–3 minutes, followed by full-plane exposure. The resist is now stripped using methoxypropanol for 30 seconds, followed by a DI water rinse. After the water rinse, the substrate is again dried at 90 degrees Celsius for 1–3 minutes.

These established methods have several disadvantages including complicated processing, cross talk, and leak current issues. In addition, the optical transparency of the organic monomers, oligomers or polymers changes upon UV irradiation due to photo-induced reactions such as photo-degradation, photo-polymerization and photo-cross-linking. This results in an optical or spectral shift as well as a change in the transparency of the conducting polymer between the exposed part and the unexposed part, that is obvious to the naked eye. Even slight optical changes are disadvantageous, especially in display devices, since such optical differences must be additionally compensated for with a modulator or controller. Ideally, the non-conducting portion of the film should be removed completely, leaving only the patterned area as seen in conventional LCD displays. Therefore, the development of a new and simple technique to selectively pattern conducting polymers is necessary for their realization as electrodes in electronic devices. This invention provides a unique method to pattern conducting polymers in a simple, economical and environmentally safe manner.

SUMMARY OF THE INVENTION

Accordingly, it is one object of the present invention to provide a novel method for patterning conducting polymer surfaces.

It is another object of this invention to provide a method for preparing patterned conducting polymer surfaces which affords patterns of conducting polymer.

It is another object of this invention to provide an inexpensive and simple method for patterning conducting polymer surfaces.

It is another object of this invention to provide a method for patterning conducting polymer surfaces which affords patterns of conducting polymer exhibiting good optical transmission properties.

These and other objects, which will become apparent during the following detailed description, have been achieved by the inventors' discovery that patterned conducting polymer surfaces exhibiting excellent properties may by prepared by:

forming a surface of a conducting polymer on a substrate;
applying a mask to the surface;
using ultraviolet irradiation to form regions of exposed conducting polymer and regions of unexposed conducting polymer;
removing the mask; and
removing the regions of exposed conducting polymer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
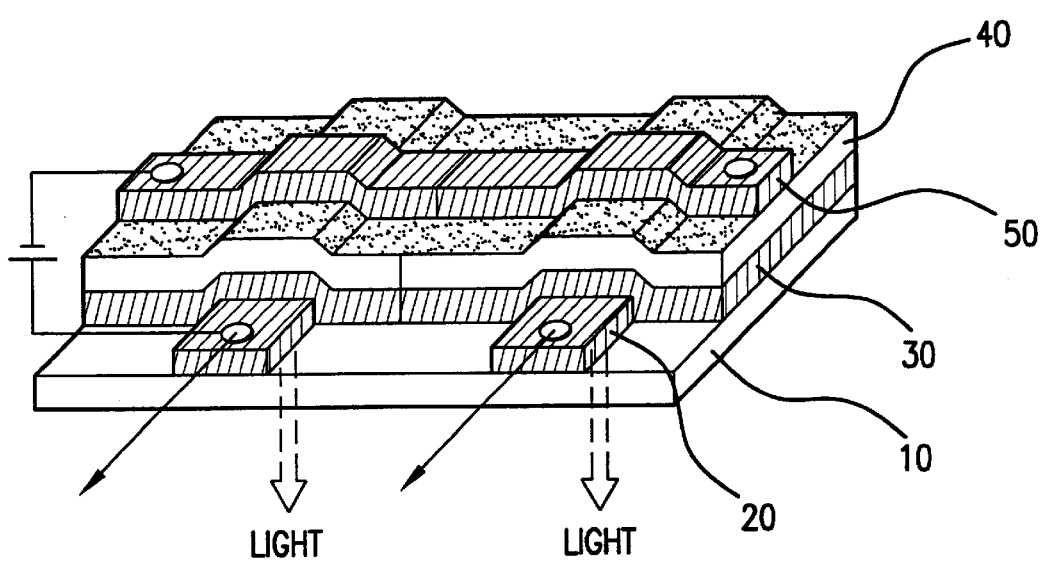
FIG. 1 is a schematic of an OLED device structure.

Thus, in a first embodiment, the present invention provides for patterning the surface of a conductive polymer by:

forming a surface of a conducting polymer on a substrate;
applying a mask to the surface;
using ultraviolet irradiation to form regions of exposed conducting polymer and regions of unexposed conducting polymer;
removing the mask; and
removing the regions of exposed conducting polymer.

The present invention describes a novel method of patterning electrically conducting polymer films 20 coated onto various rigid and/or flexible substrates 10 such as a silicon wafer, quartz, glass and plastics. Conducting polymers 20 include solvent soluble and/or water-soluble forms of polythiophenes, polyanilines, polypyrroles, their derivatives and others. This invention on conducting polymers offers a simple, cost-effective, and environmentally safe method to pattern films for many uses such as display devices, opto-electronic, electronic and electro-optical devices. These devices include but are not limited to liquid crystal displays (LCDs), organic light emitting displays (OLEDs), and organic thin film transistors. Other applications include but are not limited to photovoltaics, antistatic and conducting wires.

This invention disclosure describes a unique method to selectively pattern conducting polymers 20 by modifying the surface energy between the conducting polymer 20 and substrate 10. Good adhesion between the substrate 10 and organic layer is critical to the performance of electronic and semiconductor devices, and has been a major issue in this industry for decades. It is well known that the surface of glass, silicon wafer, metal oxides and plastics can be modified by various chemical and physical treatments. For example, hydrophilic surfaces on amorphous Si, crystalline Si, and $SiO_2$ can be conveniently obtained upon treatment with a solution of 30% $H_2O_2$ and concentrated $H_2SO_4$. Also it has been reported that silicon wafers become completely hydroxylated upon irradiation in the vacuum UV. Kim et al. reported that oxygen-plasma treatment of ITO induces a high polarity and total surface energy, resulting in an improvement of the interface formation between ITO and light emitting polymers, and therefore, improving the performance of light-emitting diodes. Oxygen plasma treatment of polyethylene terephthalates (PET) films creates a surface rich in alcohol, carbonyl and carboxyl groups and thus more hydrophilic.

FIG. 1 is a schematic of a typical OLED device structure. In one embodiment of this invention, the substrate 10 is a glass substrate and the conducting polymer 20 is PEDOT:PSS (130 nm). On the surface of the patterned polymer can be applied a layer of TPD (50 nm) 30, then on top of the TPD 30 can be applied a layer of $Alq_3$ (70 nm) 40. Next, in this one embodiment, can be applied Mg:Ag (160 nm@18:1) 50.

In this invention disclosure, a simple and environmentally friendly procedure to finely patterning conducting polymers 20 on various substrates 10 is described. This method utilizes a photo-irradiation technique to weaken the adhesion properties between organic materials such as conducting polymers 20 and various substrates 10. The organic materials are easily removed by rinsing or sonicating the substrates in mild solvent or water. This method has been demonstrated to work well on several types of substrates including glass (Corning 1737F), ITO (1000Å, Applied Films), PET films (Du Pont Melinex) and p-doped Si wafers (International Wafer Services). Other possible substrates include: quartz, silica, silicon nitride, alumina, aluminum nitride, titania, titanium nitride, diamond, waxes, polyesters, polyvinylacetate, polyolefins, polyethers, polyvinylmethylehter, polyvinylbutylether, polyamides, polyacrylamide, polyimides, polycarbonates, polysulfones, polyketones, fluoropolymers, aromatic hydrocarbon polymers, acrylate and acrylic acid polymers, phenolic polymers, polyvinylalcohol, polyamines, polypeptides, siloxane polymers, polyvinylchloride, polyvinylbenzylchloride, polychlorostyrene, polyvinylbutyral, copolymers thereof, and mixtures thereof.

The method is described in general terms followed by several specific examples. The substrates 10 must initially be thoroughly cleaned using conventional methods. Oxygen plasma treatment may be applied where high adhesion properties are required. The conducting polymer 20 is spin-coated onto the substrate 10 after filtration through a 0.45 $\mu$m PVDF filter. Possible conducting polymers include: polyacetylenes, polydiacetylenes, polyparaphenylenes, polypyrroles, polythiophenes, polybithiophenes, polyisothiophenes, polyphenylvinylenes, polythienylvinlenes, polyphenylenesulfides, and polyanilines. Preferable conducting polymers include solvent soluble and/or water soluble forms of polypyrroles, polyanilines, polythiophenes, their derivatives, and mixtures thereof. Possible spin coating parameters are speeds between 100 to 5000 rpm for about 5–500 seconds. A small amount of alcohol or surfactant may be added to the dispersion before spin coating to increase the uniformity and adhesion property of the film. A process, either chemical or physical, to promote the adhesion properties can be applied prior to or together with the coating. The film is subsequently heated, resulting in a pinhole-free film with excellent optical qualities. Possible heating temperatures between 50–300 degrees Celsius for 3–10 minutes. The film has also extremely good adhesion properties to the tape test and to rubbing with a cotton swab wet with organic solvent or water. To pattern the film, it is exposed to a light source ($\lambda$<400 nm) through a patterned photomask on top of the substrate. The substrate may be heated during light exposure to accelerate the photoreaction. The photo-irradiation of the film reduces the adhesion properties of the conducting polymer allowing it to be easily or gently removed from the substrate during sonication, for about 1–20 seconds, in an organic solvent, water or a mixture of the two solvents. Only the patterned conducting polymer remains without loss of conductivity and optical transparency. Simple washing or spraying with organic solvents or water or gentle rubbing with a cotton swab or cloth also works effectively to remove the photo-irradiated portion of the polymer. Gentle removal includes, but is not limited to, sonificating, spraying, rubbing, taping, wiping, washing, bathing, or blowing. Gentle removal usually does not include oxidizing, reducing, acidic, or basic chemicals such as permanganate, bleach, or dichromate.

Figure 2:
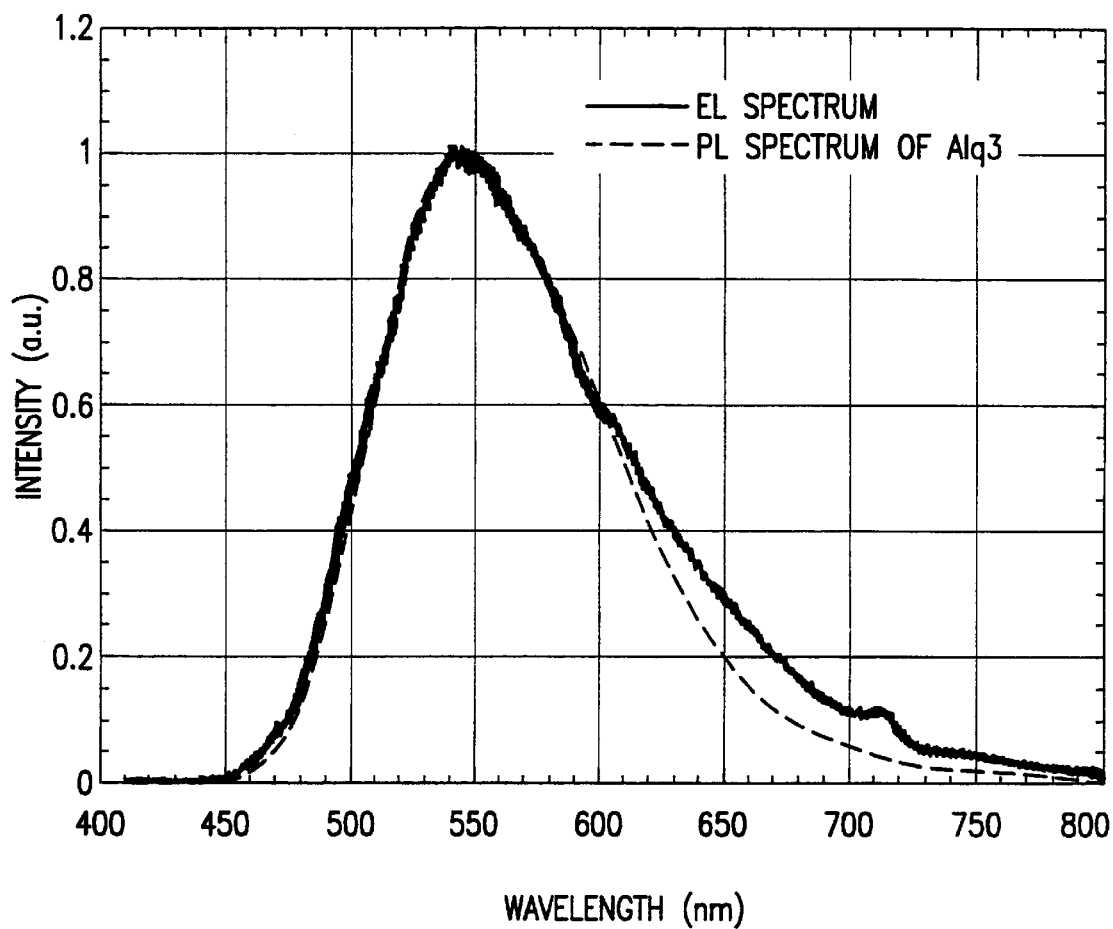
FIG. 2 is an illustration of EL spectra of PEDOT anodes device, as compared to PL spectra of $Alq_3$, in a graph of intensity v. wavelength.

FIG. 2 is an illustration of EL spectra of PEDOT anodes device, as compared to PL spectra of $Alq_3$, in a graph of intensity v. wavelength.

Figure 3:
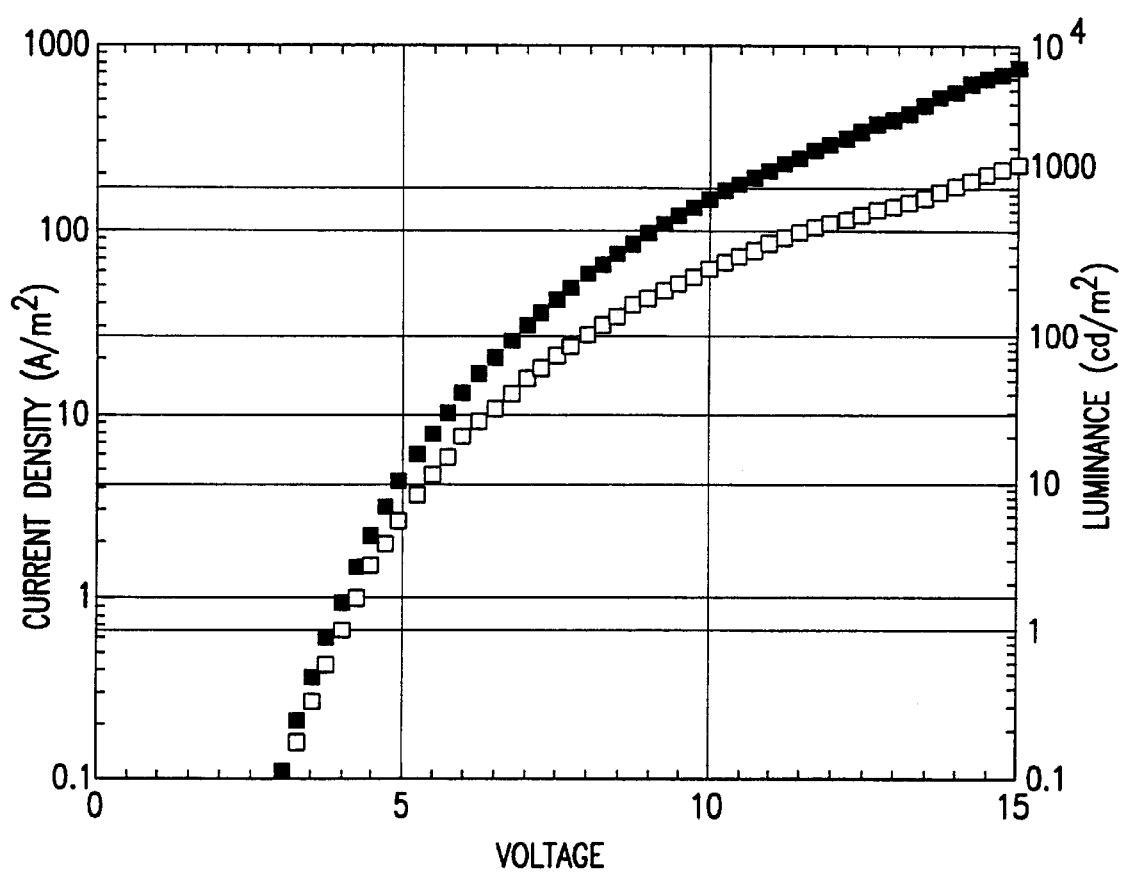
FIG. 3 is an illumination of the Current Density-Voltage-Luminance characteristics of the devices.

FIG. 3 is an illumination of the Current Density-Voltage-Luminance characteristics of the devices.

Figure 4:
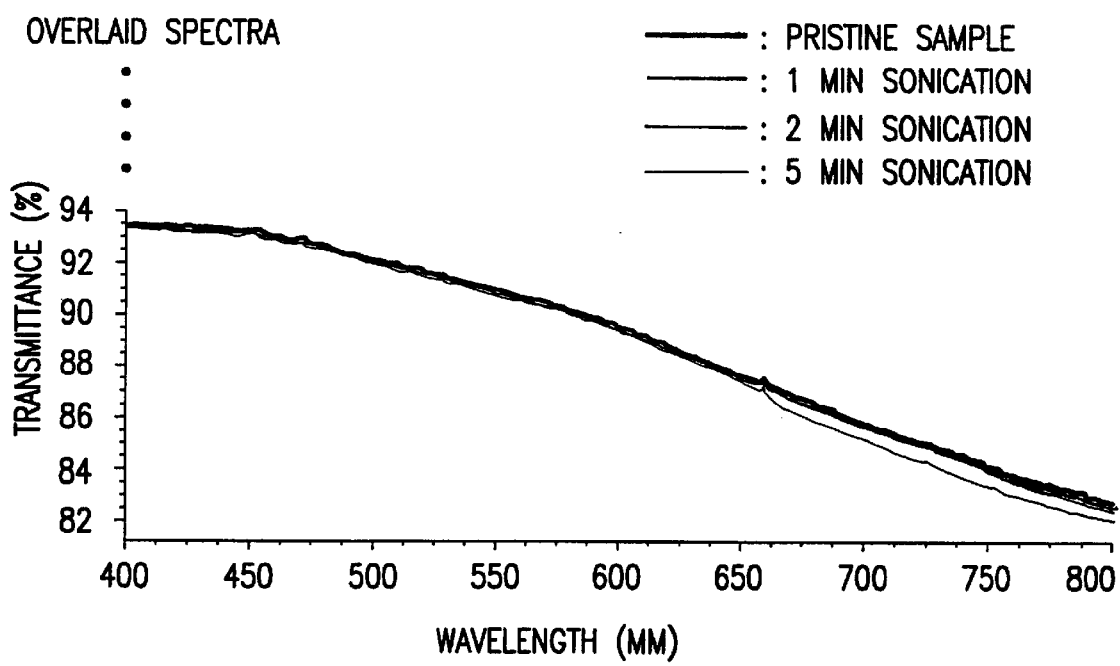
FIG. 4 is an illustration of the UV-Vis spectra of conducting polymer films after various sonication times.

FIG. 4 is an illustration of the UV-Vis spectra of conducting polymer films after various sonication times.

EXAMPLE 1

Glass substrates were cleaned by sonicating the glass in a detergent solution for 5 min., 3 times in DI $H_2O$ for 5 min, 5 minutes in acetone, 5 min in isopropanol and finally dried with $N_2$. They were treated with $O_2$ plasma to enhance the hydrophilicity of the surface. An aqueous dispersion (PEDT/PSS or PEDOT/PSS) of commercially available conducting polymer, Baytron P (Bayer, Poly(3,4-ethylenedioxythiophene) poly(styrenesulfonate), was filtered through 0.45 $\mu$m Millex PVDF filters and spin coated onto the substrates at speeds between 500 to 5000 rpm for 180 sec. Glycerol (0.1~10 wt. %) was added to the dispersion before filtration to further promote better adhesion properties. After spin coating, the film was annealed at 200° C. for 3~10 minutes. The film was washed with methanol and dried with $N_2$. The film was irradiated using a 254 nm UV lamp (~300 $\mu$W/cm$^2$ at a 6" distance) through a patterned photomask placed on top of the film. The irradiated polymer was then removed from the substrate by sonication in $H_2O$, alcohol or a mixture of the two for 1 to 20 seconds. The surface resistance and optical transparency of the films were measured before and after sonication and found to be unchanged. Patterned conducting polymer films with a resolution <10 $\mu$m was conveniently obtained using this method. FIG. 4 shows the uv-visible spectra of the film before and after various time periods of sonication. It is clearly shown that the transparency of the unexposed polymer is unaffected and unchanged upon sonication. Table 1 summarizes the changes in the surface resistance of the films before and after irradiation and sonication. It can be seen that the surface resistance of the unexposed polymer remains unchanged after sonication. It is clear that the exposed portion of the polymer is completely removed from the substrate leaving only the patterned lines of the unexposed conducting polymer.

TABLE 1

Changes in surface resistance of polymer films before and after sonication.

| 130 nm thickness film | 280 nm thickness film |
| --- | --- |
| Before Sonication: | Before Sonication: |
| Ten measurement (1.93 k$\Omega$/sq to 2.42 k$\Omega$/sq) Avg. 2.13 k$\Omega$/sq After Sonication | Ten measurement (0.78 k$\Omega$/sq to 1.16 k$\Omega$/sq) Avg. 0.94 k$\Omega$/sq After Sonication: |
| Ten measurement (1.56 k$\Omega$/sq to 2.49 k$\Omega$/sq) Avg. 2.07 k$\Omega$/sq | Ten measurement (0.68 k$\Omega$/sq to 1.09 k$\Omega$/sq) Avg. 0.87 k$\Omega$/sq |

EXAMPLE 2

P-doped silicon wafer (International wafers) substrates were cleaned by sonicating the glass in a detergent solution for 5 min., 3 times in DI $H_2O$ for 5 min, 5 minutes in acetone, 5 min in isopropanol and finally dried with $N_2$. They were treated with $O_2$ plasma to enhance the hydrophilicity of the surface. An aqueous dispersion (PEDT/PSS or PEDOT/PSS) of commercially available conducting polymer, Baytron P (Bayer, Poly(3,4-ethylenedioxythiophene) poly(styrenesulfonate), was filtered through 0.45 $\mu$m Millex PVDF filters and spin coated onto the substrates at speeds between 500 to 5000 rpm for 180 sec. Glycerol (0.1~10 wt. %) was added to the dispersion before filtration to further promote better adhesion properties. After spin coating, the film was annealed at 200° C. for 3~10 minutes. The film was washed with methanol and dried with $N_2$. The film was irradiated using a 254 nm UV lamp (~300 $\mu W/cm^2$ at a 6" distance) through a patterned photomask placed on top of the film. The irradiated polymer was then removed from the substrate by sonication in $H_2O$, alcohol or a mixture of the two for 1 to 20 seconds. The surface resistance and optical transparency of the films were measured before and after sonication and found to be unchanged. Patterned conducting polymer films with a resolution <10 $\mu$m was conveniently obtained using this method.

EXAMPLE 3

PET substrates were cleaned by sonicating the glass in a detergent solution for 5 min., 3 times in DI $H_2O$ for 5 min, 5 min in isopropanol and finally dried with $N_2$. They were treated with $O_2$ plasma to enhance the hydrophilicity of the surface. An aqueous dispersion (PEDT/PSS or PEDOT/PSS) of commercially available conducting polymer, Baytron P (Bayer, Poly(3,4-ethylenedioxythiophene) poly (styrenesulfonate), was filtered through 0.45 $\mu$m Millex PVDF filters and spincoated onto the substrates at speeds between 500 to 5000 rpm for 180 sec. Glycerol (0.1~10 wt. %) was added to the dispersion before filtration to further promote better adhesion properties. After spin coating, the film was annealed at 140° C. for 3~10 minutes. The film was washed with methanol and dried with $N_2$. The film was irradiated using a 254 nm UV lamp (~300 $\mu W/cm^2$ at a 6" distance) through a patterned photomask placed on top of the film. The irradiated polymer was then removed from the substrate by sonication in $H_2O$, alcohol or a mixture of the two for 1 to 20 seconds. The surface resistance and optical transparency of the films were measured before and after sonication and found to be unchanged. Patterned conducting polymer films with a resolution <10 $\mu$m was conveniently obtained using this method.

This invention provides a simple, cost-effective and environmentally friendly method to finely pattern conducting polymers, and can be applied to any kind of rigid or flexible substrates. In addition, there is no limitation to the size of the substrate. All of the patterning steps can be carried out in a continuous process. This method does not require complicated vacuum processes or costly equipment. It provides more environmentally safe conditions than other patterning methods since toxic solvents and acids are not involved throughout the process. Aqueous based conducting polymers can also be used where the stripping process can be carried out using water as illustrated in the above mentioned examples. Furthermore, sub-micron resolution can be obtained when the proper mask system is used. The mask provides any desired shape or geometry for the patterned conducting polymer layer.

Numerous modifications and variations of the present invention are possible in light of the above teachings. It is therefore to be understood that, within the scope of the claims, the invention may be practiced otherwise than as specifically described herein.

What is claimed is:

1. A process for patterning a conducting polymer surface, said process comprising the steps of:

forming a surface of a conducting polymer on a substrate;

applying a mask to said surface;

applying irradiation to form regions of exposed conducting polymer and regions of unexposed conducting polymer;

removing said mask; and gently removing by non-chemically reactive means said regions of exposed conducting polymer.

2. The process of claim 1, wherein said substrate is selected from the group consisting of glass, quartz, silica, silicon, silicon nitride, alumina, aluminum nitride, titania, titanium nitride, diamond, waxes, polyesters, polyvinylacetates, polyolefins, polyethers, polyvinylmethylehter, polyvinylbutylethers, polyamides, polyacrylamides, polyimides, polycarbonates, polysulfones, polyketones, fluoropolymers, aromatic hydrocarbon polymers, acrylate and acrylic acid polymers, phenolic polymers, polyvinylalcohols, polyamines, polypeptides, siloxane polymers, polyvinylchlorides, polyvinylbenzylchlorides, polychlorostyrenes, polyvinylbutyrals, copolymers thereof, and mixtures thereof.

3. The process of claim 1, wherein said conducting polymer is selected from the group consisting of cis and trans polyacetylenes, polythiophenes, polydiacetylenes, polyparaphenylenes, polypyrroles, polybithiophenes, polyisothiophenes, polyphenylvinylenes, polythienylvinlenes, polyphenylenesulfides, polyanilines, derivatives thereof, and mixtures thereof.

4. The process of claim 3, wherein said conducting polymer is doped.

5. The process of claim 1, wherein said conducting polymer is polypyrrole.

6. The process of claim 1, wherein said conducting polymer is polyaniline.

7. The process of claim 1, wherein said conducting polymer is polythiophene.

8. The process of claim 1, wherein said conducting polymer is PEDOT:PSS.

9. The process of claim 1, wherein said irradiation is ultraviolet radiation.

10. The process of claim 1, wherein the wavelength of said irradiation is <400 nm.

11. The process of claim 1, further comprising the step of using an adhesion promoter.

12. The process of claim 1, wherein said step of removing said regions of exposed conducting polymer is by sonicating.

13. The process of claim 12, wherein said sonicating is in a mild solvent, an alcoholic solution, water, or any combination thereof.

14. The process of claim 1, wherein said step of removing said regions of exposed conducting polymer is by spray washing with a mild solvent, an alcoholic solution, water, or any combination thereof.

15. The process of claim 1, wherein said step of removing said regions of exposed conducting polymer is by wiping, rubbing, taping, or blowing.

16. The process of claim 1, wherein an adhesion property between the polymer and the substrate is weakened upon irradiation.

* * * * *